United States Patent [19]

Blanchard et al.

[11] Patent Number: 4,679,301

[45] Date of Patent: Jul. 14, 1987

[54] PROCESS FOR PRODUCING SILICIDE OR SILICON GATES FOR AN INTEGRATED CIRCUIT HAVING ELEMENTS OF THE GATE-INSULATOR-SEMICONDUCTOR TYPE

[75] Inventors: Pierre Blanchard, Echirolles; Jean P. Cortot, Grenoble, both of France

[73] Assignee: Thomson-Csf, Paris, France

[21] Appl. No.: 782,140

[22] Filed: Sep. 30, 1985

[30] Foreign Application Priority Data

Oct. 2, 1984 [FR] France .................. 84 15125

[51] Int. Cl.⁴ .......................... H01L 21/283
[52] U.S. Cl. ...................... 29/571; 29/579; 29/578; 29/591; 148/DIG. 147; 156/653
[58] Field of Search ............. 29/571, 579, 591, 578; 148/1.5, 188, DIG. 143, DIG. 147; 427/93, 91; 156/643, 644, 634, 652, 653

[56] References Cited

U.S. PATENT DOCUMENTS

| | | |
|---|---|---|
| 3,866,310 | 2/1975 | Driver et al. ............ 29/571 |
| 3,908,262 | 9/1975 | Stein ..................... 29/579 |
| 4,077,111 | 3/1978 | Driver et al. ............ 29/571 |
| 4,157,269 | 6/1979 | Ning et al. .............. 148/1.5 |
| 4,196,507 | 4/1980 | Baptiste ................. 29/571 |
| 4,470,189 | 9/1984 | Roberts et al. ........... 29/571 |
| 4,525,919 | 7/1985 | Fabian ................... 29/571 |
| 4,545,114 | 10/1985 | Ito et al. ............... 29/529 |

FOREIGN PATENT DOCUMENTS 0075085  3/1983  European Pat. Off. .

OTHER PUBLICATIONS

S. P. Murarka, "Refractory Silicided for Integrated Circuit", J. Vac. Sci. Technology 17(4), Jul./Aug. 1980 pp. 775–792.

Primary Examiner—Brian E. Hearn
Assistant Examiner—T. N. Quach
Attorney, Agent, or Firm—Roland Plottel

[57] ABSTRACT

A process for forming closely spaced silicon or silicon-silicide gate electrodes for an integrated circuit involving the successive deposition over the semiconductive substrate of layers of silicon oxide, polycrystalline silicon, a metal, for example, tantalum which can be converted to a silicide, an oxide layer and a masking layer. Then the masking layer is patterned by photolithography and the exposed oxide layer etched in a fashion to undercut the overlying masking layer to leave an overhang. Then the exposed metal layer is removed, and the metal forming a silicide redeposited through the opening in the masking layer on the central portion of the exposed polycrystalline corresponding to the opening. The metal is then converted to a silicide and the polycrystalline silicon free of the silicide is removed.

11 Claims, 7 Drawing Figures

FIG_1-a 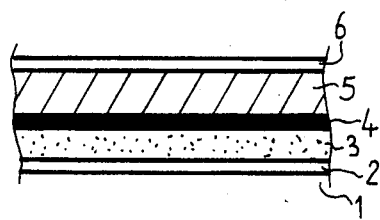
FIG_1-b 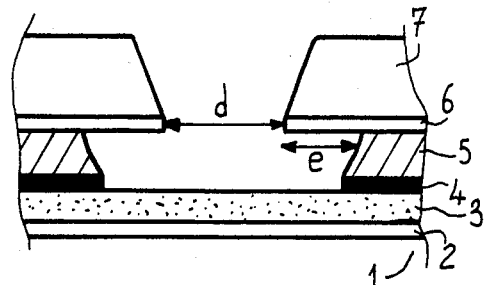
FIG_1-c 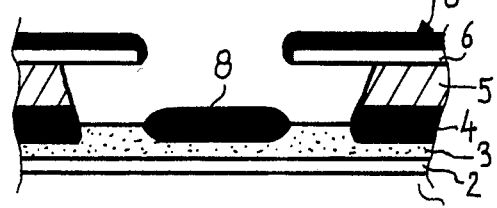
FIG_1-d 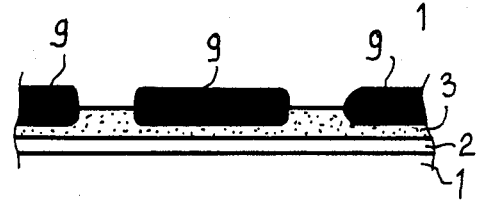
FIG_1-e 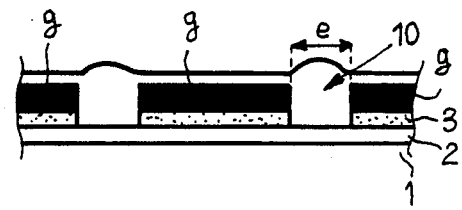
FIG_2-a 
PRIOR ART
FIG_2-b 

PROCESS FOR PRODUCING SILICIDE OR SILICON GATES FOR AN INTEGRATED CIRCUIT HAVING ELEMENTS OF THE GATE-INSULATOR-SEMICONDUCTOR TYPE

BACKGROUND OF THE INVENTION

1. Field of the Invention

The present invention relates to a process for producing silicide or silicon gates for an integrated circuit having gate-insulator-semiconductor-type elements. It more particularly relates to a novel process making it possible to obtain a very small spacing between gates, which gives integrated circuits, particularly charge transfer devices or circuits using elements of the MOS type (metal - oxide - semiconductor) of a very compact nature.

2. Description of the Prior Art

In the aforementioned circuits, the gates are made from a conductive material, which can e.g. be a metal such as aluminium, a metaloid such as highly doped polycrystalline silicon or formed from a double layer of highly doped polycrystalline silicon covered with a silicide. Photolithography is conventionally used for producing polycrystalline silicon gates or double layer polycrystalline silicon - silicide gates. Thus, according to one of these conventional processes, in order to obtain gates with a double polycrystalline silicon - silicide layer, following the definition of the elements of the circuit by opening windows in a thick insulating layer covering the semiconductor substrate and depositing a thin insulating layer, on the complete circuit is deposited a polycrystalline silicon layer, which is covered with a metal layer giving a silicide. The gates are then defined by masking, irradiation, development and etching. The assembly then undergoes annealing in a neutral atmosphere in order to transform the metallic layer in contact with the polycrystalline silicon into silicide. This process is very simple, but does not make it possible to obtain a spacing between the gates below 2.5 μm.

SUMMARY OF THE INVENTION

The present invention aims at obviating this disadvantage by providing a novel process for producing silicide gates for an integrated circuit having elements of the gate - insulator - semiconductor type, so that it is possible to obtain a spacing between the gates of less than 1 μm.

Thus, the present invention relates to a process for producing silicide gates for an integrated circuit having elements of the gate - insulator - semiconductor type, wherein the following stages are used:

successive deposition on the insulator covering the semiconductor of an appropriately doped polycrystalline silicon layer, a metal layer giving a silicide, an oxide layer and a masking layer, producing openings in the masking layer in per se known manner, producing at the openings an overhang beneath the masking layer by eliminating the oxide layer over a certain length, elimination of the metal layer defined by the overhang, deposition in the openings of a new metal layer giving a silicide, annealing the complete circuit in a neutral atmosphere for transforming those parts where the metal layer is in contact with the polycrystalline silicon layer into silicide, elimination of layers covering the silicide parts, eliminating the polycrystalline silicon between the silicide parts to define the gates.

With this process, it is possible to very efficiently control the length of the overhang, which in fact determines the spacing between the gates as will be explained in greater detail hereinafter. Thus, the overhang is obtained by the deoxidation of the oxide layer and the lengths over which said deoxidation occurs is a function of the oxide layer thickness and of the deoxidation time. Thus, by controlling these two parameters, it is possible to control the overhang length and consequently the spacing between the gates.

BRIEF DESCRIPTION OF THE DRAWINGS

The invention is described in greater detail hereinafter relative to a non-limitative embodiment and the attached drawings, wherein show:

FIGS. 1a to 1e diagrammatically the different stages of the process for producing silicide gates according to the invention.

FIGS. 2a and 2b diagrammatically a circuit with two levels of gates obtained respectively according to a prior art process and according to the process of the invention.

In the drawings, the same references designate the same elements, but for reasons of clarity the dimensions and proportions of these various elements have not been respected.

DESCRIPTION OF THE PREFERRED EMBODIMENT

According to the process of the invention, after forming on an e.g. type p silicon semiconductor substrate 1 a thin, continuous layer 2 of an insulating material such as silicon dioxide ($SiO_2$), said silicon dioxide layer is covered with an appropriately doped polycrystalline silicon layer 3. Typically the polycrystalline silicon is phosphorus-doped.

A metal layer 4 is deposited on the polycrystalline silicon layer 3. Metal layer 4 is made from a metal able to react with the polycrystalline silicon to give a silicide. For example, the metal layer can be of tungsten, molybdenum, titanium, tantalum, chrome or nickel. However, it is preferably made from tantalum, because the latter when alloyed with silicon is virtually inert with respect to the chemical agents used during the other phases of the process and in particular hydrofluoric acid.

An oxide layer 5 is vapour phase deposited on the metal layer. This deposition can take place at atmospheric or low pressure, in accordance with processes known as chemical vapour deposition (CVD) and low temperature oxidation (LTO). Deposition preferably takes place at a temperature below the alloy formation temperature. Moreover, the layer thickness is accurately chosen. Thus, as will be explained hereinafter, the oxide layer thickness is one of the parameters determining the spacing between the gates.

On said pyrolytic oxide layer is deposited a masking layer 6, which is preferably of silicon nitride ($Si_3N_4$), which leads to the structure shown in FIG. 1a.

Then, using the known photolithography process, windows are opened in the masking layer 6 and their dimensions d correspond to those of the gates which it is wished to produce. For this purpose and in per se known manner, a photosensitive resin 7, e.g. of the positive type is deposited on the silicon nitride layer 6. The resin is baked to harden it. Then an e.g. chrome-on-glass mask is applied to the resin with a view to defining the windows to be opened.

The resin is irradiated with ultraviolet rays through the mask in order to polymerize it at the points not protected by the mask, followed by development in an appropriate product, which dissolves the polymerized resin, leaving behind unpolymerized resin. The silicon nitride layer 6 is then etched to give windows d.

The pyrolytic oxide layer 5 is then eliminated so as to give an overhang of predetermined length e beneath the masking layer. For this purpose, said layer is deoxidized in an e.g. hydrofluoric acid solution, which dissolves the oxide, but leaves the metal layer intact, particularly when the said layer is of tantalum. Deoxidization takes place over a length e corresponding at least to the thickness of layer 6 and which can be modified as a function of the deoxidation time.

The metal layer in the thus formed opening is then eliminated by etching, as shown in FIG. 1b. A new metal layer 8 is then deposited on the complete circuit so as to give a silicide. This layer is deposited on the polycrystalline silicon in the opening over a distance d and as shown in FIG. 1c.

The complete circuit then undergoes annealing in a neutral atmosphere, e.g. argon, in order to transform into silicide those parts where the metal layer 4 and 8 is in contact with the polycrystalline silicon layer 3. Annealing is preferably carried out for approximately 30 minutes at a temperature between 900° and 1100° C.

This is followed by elimination by chemical etching of the various layers 5, 6, 8 covering the silicide parts 9, which gives the structure shown in FIG. 1d.

This is followed by the removal of the polycrystalline silicon located between the silicide portions, so as to irradiate gates g. This polycrystalline silicon elimination can be carried out by dry etching or by dry oxidation.

Optionally the gates can be produced solely from polycrystalline silicon, eliminating the silicide layer 9, said elimination taking place by etching. This type of gate is of particular interest in the case of photo-MOS sensors where the gates must be transparent.

The gates are then optionally covered with a passivating layer 10, as shown in FIG. 1e.

Thus, with the aforementioned process, it is possible to produce gates with a double polycrystalline silicon-silicide layer or silicon gates having a clearly defined spacing e between them. This spacing is no longer a function of the masking methods used, but of the thickness of the oxide layer, which can be controlled to very low values and also of the precision of the deoxidation time.

This process is of particular interest for producing charge transfer devices of the CCD (charge coupled device) type, which are constituted by several groups of MIS (metal - insulator - semiconductor) capacitors in juxtaposed form, which form storage and transfer capacitors.

With the process according to the present invention, it is possible to produce CCD's at a single more compact level of silicide gates than in the presently available CCD's. Thus, it is possible to obtain a CCD operating in three phases having a spacing of 9 $\mu$m or a CCD operating in four phases with a spacing of 12 $\mu$m. This makes it possible to obtain a gain on the density of the CCD stages and to have a lower phase coupling.

The process according to the invention is also of interest in the case of CCD's with two gate levels. Thus, as shown in FIG. 2a, the spacing $e_1$ between gates $g_2$ is at least 2 to 3 $\mu$m, because the conventionally used photolithography methods for producing the second level of gates does not make it possible to obtain a smaller spacing. The overlapping of gate $g_2$ on gate $g_1$ is effected over a distance of at least 1 $\mu$m, which gives a width of at least 4 to 5 $\mu$m for gate $g_1$. However, as shown in FIG. 2b, by using the process according to the present invention, it is possible to obtain a spacing $e_2$ between gates $g_2$ of less than 1 $\mu$m. It is therefore possible to obtain a gate $g_1$ having a width less than 3 $\mu$m.

Moreover, in the case of two levels of gates, it is possible to envisage producing the first level of gates in polycrystalline silicon and the second in silicide, which is of interest for producing photosensitive devices. In this case, the first level of gates is preferably produced by using the known procedure, because the spacing between the gates must be adequate to receive the second level of gates. However, after depositing an insulating layer on the first level of gates, the second level of silicide gates is obtained by using the process according to the invention.

What is claimed is:

1. A process for producing closely spaced gate electrodes on a silicon semiconductive substrate for an integrated circuit comprising:
    depositing on the top surface of the substrate successively, layers of silicon oxide, polycrystalline silicon, a metal which can be converted to a silicide, an oxide and a masking material,
    patterning the masking layer to provide openings where there is exposed the underlying oxide layer,
    etching the oxide layer isotropically to undercut the masking layer to obtain overhang, thereby exposing portions of the metal layer larger than the openings in the masking layer,
    etching the exposed portions of the metal layer, for exposing the underlying polycrystalline silicon,
    depositing through the openings in the masking layer a layer of a metal which can be converted into a silicide on only the central portion of the exposed polycrystalline layer, corresponding essentially to the opening in the masking layer,
    annealing the substrate for converting the metal in the portions contacting the polycrystalline layer to silicide, and
    removing both the layers the silicide portions and the unconverted polycrystalline silicon portions between the silicide portions to define the silicide gates.

2. A process for producing silicide gates according to claim 1, wherein both the first deposited metal and the second deposited metal are the same metal chosen from among tantalum, titanium, tungsten or molybdenum.

3. A process for producing silicide gates according to claim 1, wherein the masking layer is a silicon nitride layer.

4. A process for producing silicide gates according to claim 1, wherein the openings in the masking layer are produced by photolithography and etching.

5. A process for producing silicide gates according to claim 1, wherein the oxide layer is etched by deoxidation.

6. A process for producing silicide gates according to claim 1, wherein the length of the overhang is defined by the thickness of the oxide layer and the deoxidation time.

7. A process for producing gates according to claim 1, wherein annealing is performed at temperature between 900° and 1100° C.

8. A process for producing silicide gates according to claim 1, wherein annealing is performed under a neutral argon atmosphere.

9. A process for producing two levels of gates, comprising producing a first level of gates, depositing on said first level an insulating layer, and forming a second level of gates thereover by the process according to claim 1.

10. A process for producing two levels of gates according to claim 9, wherein the gates of the first level are chosen from either doped polycrystalline silicon gates or gates formed from a double polycrystalline silicon - silicide layer.

11. A process for producing polycrystalline silicon gates wherein gates are produced by using the process according to claim 1, followed by the elimination of the silicide overlying the polycrystalline silicon for leaving only polycrystalline gates after removing the layers covering the silicide.

* * * * *